(12) United States Patent
Niwa et al.

(10) Patent No.: US 10,026,851 B2
(45) Date of Patent: Jul. 17, 2018

(54) MPS DIODE

(71) Applicant: TOYODA GOSEI CO., LTD., Kiyosu-shi (JP)

(72) Inventors: Takaki Niwa, Kiyosu (JP); Takahiro Fujii, Kiyosu (JP); Masayoshi Kosaki, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/442,359

(22) Filed: Feb. 24, 2017

(65) Prior Publication Data

US 2017/0256657 A1  Sep. 7, 2017

(30) Foreign Application Priority Data

Mar. 1, 2016 (JP) .................. 2016-038851

(51) Int. Cl.
*H01L 29/15* (2006.01)
*H01L 29/872* (2006.01)
(Continued)

(52) U.S. Cl.
CPC ........ *H01L 29/872* (2013.01); *H01L 29/0619* (2013.01); *H01L 29/2003* (2013.01);
(Continued)

(58) Field of Classification Search
CPC ............... H01L 29/872; H01L 29/0619; H01L 29/2003; H01L 29/207; H01L 29/402; H01L 29/868; H01L 29/36
(Continued)

(56) References Cited

U.S. PATENT DOCUMENTS

2010/0148040 A1\* 6/2010 Sanfilippo ........... H01L 31/1075
250/214.1
2014/0138705 A1\* 5/2014 Zhang ................. H01L 29/6606
257/77

(Continued)

FOREIGN PATENT DOCUMENTS

JP  2002076370 A  \*  3/2002
JP  2013-232564 A      11/2013
JP  2014-110310 A      6/2014

*Primary Examiner* — Anthony Ho
*Assistant Examiner* — Mohammad M Hoque
(74) *Attorney, Agent, or Firm* — McGinn IP Law Group, PLLC.

(57) ABSTRACT

There is provided an MPS diode comprising a first semiconductor layer that is an N type; P-type semiconductor regions and N-type semiconductor regions that are arranged alternately on one surface of the first semiconductor layer; and a Schottky electrode that is in Schottky junction with the N-type semiconductor regions and is arranged to be adjacent to and in contact with at least part of the P-type semiconductor regions. A donor concentration in an area of the N-type semiconductor region that is adjacent to and in contact with the first semiconductor layer is lower than the donor concentration in an area of the first semiconductor layer that is adjacent to and in contact with the N-type semiconductor region and is lower than the donor concentration in an area of the N-type semiconductor region that is adjacent to and in contact with the Schottky electrode. This configuration improves a breakdown voltage under applying a reverse bias voltage and reduces a rising voltage under applying a forward bias voltage.

18 Claims, 11 Drawing Sheets

(51) Int. Cl.
  *H01L 29/868* (2006.01)
  *H01L 29/40* (2006.01)
  *H01L 29/36* (2006.01)
  *H01L 29/207* (2006.01)
  *H01L 29/20* (2006.01)
  *H01L 29/06* (2006.01)

(52) U.S. Cl.
  CPC ............ *H01L 29/207* (2013.01); *H01L 29/36* (2013.01); *H01L 29/402* (2013.01); *H01L 29/868* (2013.01)

(58) Field of Classification Search
  USPC .......................................................... 257/76
  See application file for complete search history.

(56) References Cited

U.S. PATENT DOCUMENTS

| | | | |
|---|---|---|---|
| 2014/0264366 A1* | 9/2014 | Kosaki | H01L 29/2003 257/76 |
| 2014/0361398 A1* | 12/2014 | Higashida | H01L 29/872 257/471 |
| 2015/0115285 A1 | 4/2015 | Kinoshita et al. | |

* cited by examiner

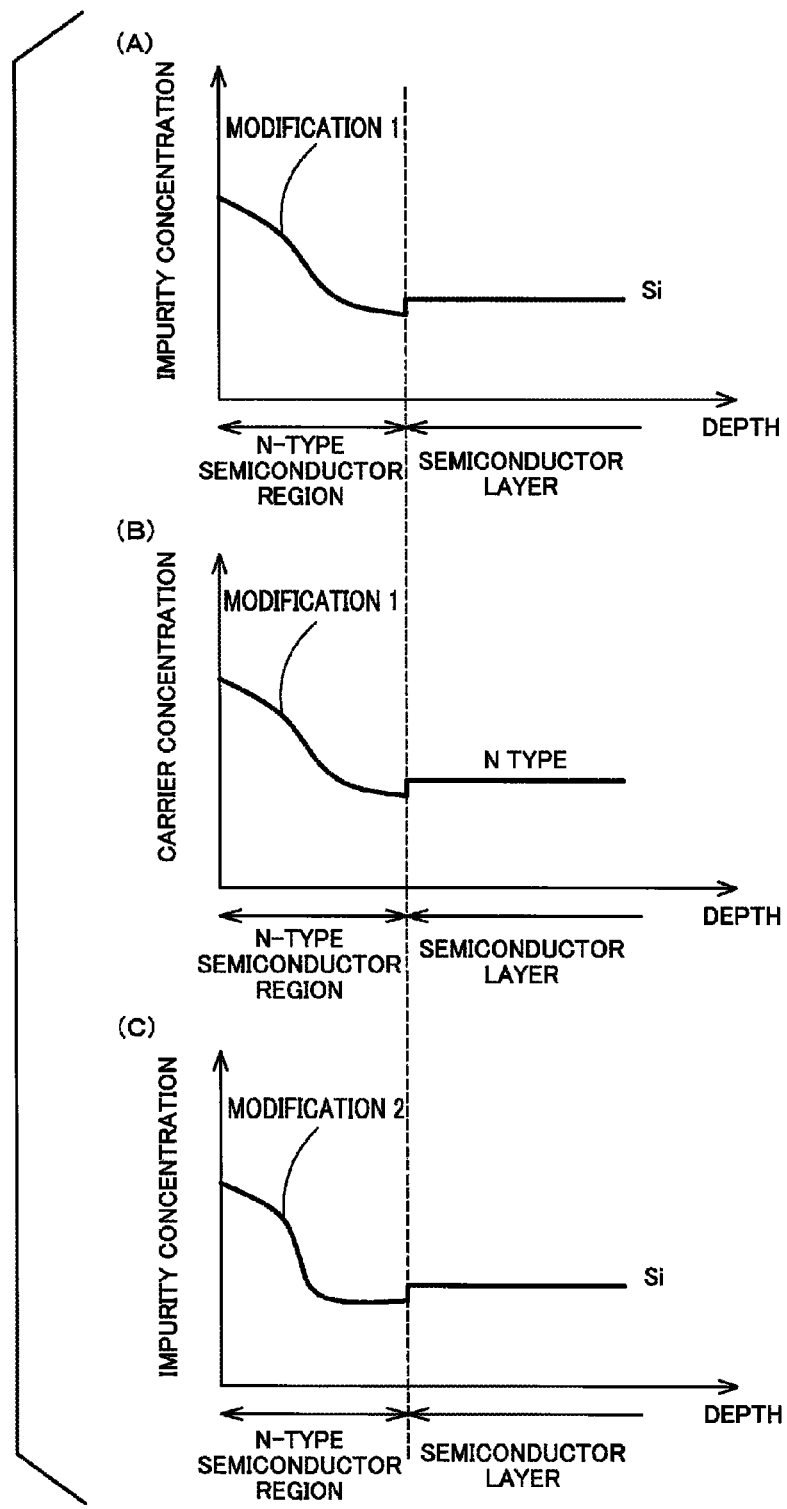

MPS DIODE

CROSS-REFERENCE TO RELATED APPLICATION

The present application claims priority from Japanese patent applications No. 2016-038851 filed on Mar. 1, 2016, the content of which is hereby incorporated by reference into this application.

BACKGROUND

Field

The disclosure relates to an MPS diode.

Related Art

One conventionally known semiconductor device is an MPS diode having an MPS (merged PiN Schottky) structure that is a combination of a PN junction diode having a PN junction structure of a P-type semiconductor and an N-type semiconductor with a Schottky barrier diode (SBD) (as described in, for example, JP 2014-110310A and JP 2013-232564A).

An MPS diode described in JP 2014-110310A includes a drift layer that is formed from an N-type nitride compound-based semiconductor, a P-type region and an N-type region that are formed on a surface of the drift layer, and an electrode that is in Schottky contact with the N-type region and comes in contact with at least part of the P-type region.

In terms of further improving the power conversion efficiency of the MPS diode, there is a demand for a technique that improves the breakdown voltage of the MPS diode under applying a reverse bias voltage and reduces the rising voltage under applying a forward bias voltage.

SUMMARY

In order to solve at least part of the problems described above, the disclosure may be implemented by aspects or configurations described below.

(1) According to one aspect of the invention, there is provided an MPS diode. The MPS diode comprises: a first semiconductor layer being an N type; P-type semiconductor regions and N-type semiconductor regions arranged alternately on one surface of the first semiconductor layer; and a Schottky electrode in Schottky junction with the N-type semiconductor regions and arranged to be adjacent to and in contact with at least part of the P-type semiconductor regions, wherein a donor concentration in an area of the N-type semiconductor region that is adjacent to and in contact with the first semiconductor layer is lower than the donor concentration in an area of the first semiconductor layer that is adjacent to and in contact with the N-type semiconductor region and is lower than the donor concentration in an area of the N-type semiconductor region that is adjacent to and in contact with the Schottky electrode. The MPS diode of this aspect improves the breakdown voltage under applying a reverse bias voltage and reduces the rising voltage under applying a forward bias voltage.

(2) According to one embodiment of the MPS diode, with respect to a direction from the first semiconductor layer toward the Schottky electrode, when the N-type semiconductor region is divided into two parts, an average donor concentration in a Schottky electrode-side part of the N-type semiconductor region may be higher than the average donor concentration in a first semiconductor layer-side part of the N-type semiconductor region. The MPS diode of this aspect further improves the breakdown voltage under applying a reverse bias voltage.

(3) According to one embodiment of the MPS diode, with respect to a direction from the first semiconductor layer toward the Schottky electrode, the donor concentration in the N-type semiconductor region may be kept constant or may be gradually decreased from a Schottky electrode side thereof toward a first semiconductor layer side thereof. The MPS diode of this aspect improves the breakdown voltage under applying a reverse bias voltage and reduces the rising voltage under applying a forward bias voltage.

(4) According to one embodiment of the MPS diode, with respect to a direction from the first semiconductor layer toward the Schottky electrode, the donor concentration in the N-type semiconductor region may be gradually decreased from a Schottky electrode side thereof toward a first semiconductor layer side thereof. The MPS diode of this aspect further improves the breakdown voltage under applying a reverse bias voltage.

(5) According to one embodiment of the MPS diode, with respect to a direction from the first semiconductor layer toward the Schottky electrode, the N-type semiconductor region may include an area where the donor concentration is constant. The MPS diode of this aspect improves the breakdown voltage under applying a reverse bias voltage and reduces the rising voltage under applying a forward bias voltage.

(6) According to one embodiment of the MPS diode, an average acceptor concentration in the P-type semiconductor region may be not lower than 100 times an average donor concentration in the first semiconductor layer. The MPS diode of this aspect further improves the breakdown voltage under applying a reverse bias voltage.

(7) According to one embodiment of the MPS diode, with respect to a direction from the first semiconductor layer toward the Schottky electrode, an average acceptor concentration in the P-type semiconductor region may be higher than an average donor concentration in a first semiconductor layer-side part of the N-type semiconductor region when the N-type semiconductor region is divided into two equal parts. The MPS diode of this aspect further improves the breakdown voltage under applying a reverse bias voltage.

(8) According to one embodiment of the MPS diode, a surface of the P-type semiconductor region that is adjacent to and in contact with the first semiconductor layer may be approximately flush with a surface of the N-type semiconductor region that is adjacent to and in contact with the first semiconductor layer. The MPS diode of this aspect improves the breakdown voltage under applying a reverse bias voltage and reduces the rising voltage under applying a forward bias voltage.

(9) According to one embodiment, the MPS diode may further comprise an N-type ohmic electrode located on an opposite side to the Schottky electrode with respect to the first semiconductor layer. The MPS diode of this aspect improves the breakdown voltage under applying a reverse bias voltage and reduces the rising voltage under applying a forward bias voltage.

(10) According to one embodiment of the MPS diode, the P-type semiconductor region and the N-type semiconductor region may be mainly made of gallium nitride. The MPS diode of this aspect improves the breakdown voltage under applying a reverse bias voltage and reduces the rising voltage under applying a forward bias voltage.

(11) According to one embodiment of the MPS diode, the N-type semiconductor region may contain silicon, and the P-type semiconductor region may contain magnesium. The MPS diode of this aspect improves the breakdown voltage under applying a reverse bias voltage and reduces the rising voltage under applying a forward bias voltage.

(12) According to one embodiment, the MPS diode may further comprise a second semiconductor layer being an N type, located between the first semiconductor layer and the N-type ohmic electrode and having an average donor concentration higher than the average donor concentration in the first semiconductor layer. The MPS diode of this aspect reduces the contact resistance between the second semiconductor layer and the N-type ohmic electrode.

(13) According to one embodiment of the MPS diode, the P-type semiconductor regions may be arranged at respective ends of an array of the P-type semiconductor regions and the N-type semiconductor regions arranged alternately. The MPS diode of this aspect improves the breakdown voltage at the respective ends.

(14) According to one embodiment, the MPS diode may further comprise a field plate electrode electrically connected with the Schottky electrode and provided to cover the P-type semiconductor regions arranged at the respective ends via an insulation film, wherein with respect to a direction from the first semiconductor layer toward the Schottky electrode, a most first semiconductor layer-side surface of the field plate electrode is located on a Schottky electrode side of a surface of the P-type semiconductor region that is adjacent to and in contact with the first semiconductor layer and is located on a first semiconductor layer side of a surface of the N-type semiconductor region that is adjacent to and in contact with the Schottky electrode. The MPS diode of this aspect improves the breakdown voltage.

The disclosure may be implemented by any of various aspects other than the MPS diode, for example, a manufacturing method of the MPS diode and an apparatus of manufacturing the MPS diode by this manufacturing method.

The MPS diode according to any one of aspects described above improves the breakdown voltage under applying a reverse bias voltage and reduces the rising voltage under applying a forward bias voltage.

BRIEF DESCRIPTION OF DRAWINGS

FIG. 15 is a diagram showing variations in concentrations relating to the carrier in the sections according to modifications.

DESCRIPTION OF EMBODIMENTS

A. First Embodiment

A-1. Structure of Semiconductor Device

Figure 1:
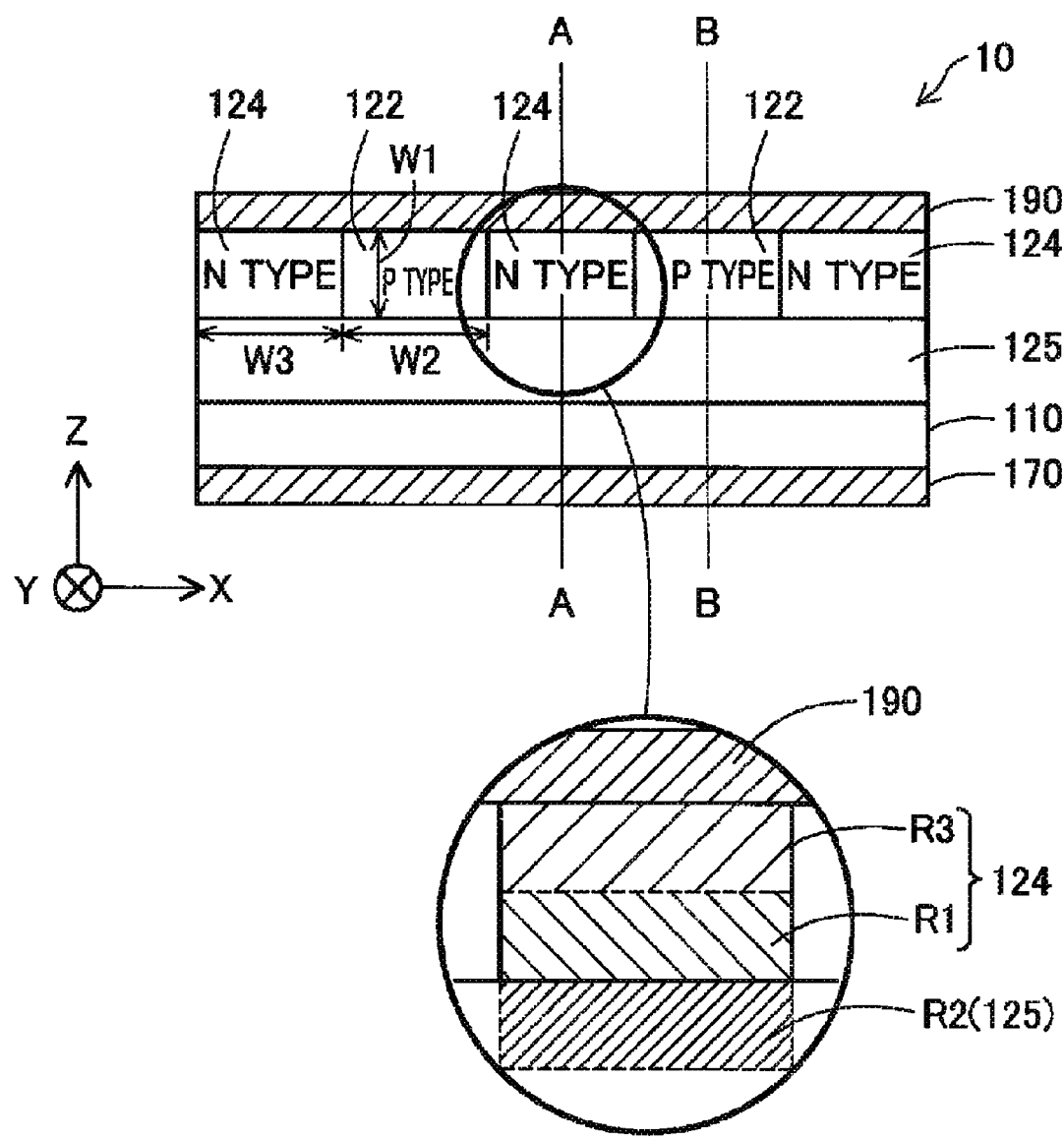
FIG. 1 is a sectional view schematically illustrating the structure of a semiconductor device according to a first embodiment.

FIG. 1 is a sectional view schematically illustrating the structure of a semiconductor device 10 according to a first embodiment. XYZ axes that are orthogonal to one another are illustrated in FIG. 1.

Among the XYZ axes of FIG. 1, the X axis denotes a left-right axis on the sheet surface of FIG. 1. +X-axis direction denotes a rightward direction on the sheet surface, and −X-axis direction denotes a leftward direction on the sheet surface. Among the XYZ axes of FIG. 1, the Y axis denotes a front-back axis on the sheet surface of FIG. 1. +Y-axis direction denotes a backward direction on the sheet surface, and −Y-axis direction denotes a forward direction on the sheet surface. Among the XYZ axes of FIG. 1, the Z axis denotes a top-bottom axis on the sheet surface of FIG. 1. +Z-axis direction denotes an upward direction on the sheet surface, and −Z-axis direction denotes a downward direction on the sheet surface.

According to this embodiment, the semiconductor device 10 is an MPS (merged PiN schottky) diode and is a GaN-based semiconductor device formed by using gallium nitride (GaN) as a nitride semiconductor. The semiconductor device 10 may include a substrate 110, a semiconductor layer 125, P-type semiconductor regions 122, N-type semiconductor regions 124, a rear face electrode 170 and a Schottky electrode 190. The nitride semiconductor used is not limited to gallium nitride (GaN) but may be, for example, indium gallium nitride (InGaN), aluminum gallium nitride (AlGaN) or indium aluminum gallium nitride (InAlGaN). The semiconductor material used may not be necessarily limited to the nitride semiconductor but may be another semiconductor, for example, silicon (Si) or silicon carbide (SiC).

The substrate 110 of the semiconductor device 10 is a semiconductor layer extended along the X axis and the Y axis. The substrate 110 is formed from a nitride semiconductor. According to this embodiment, the substrate 110 is an N-type semiconductor layer that is mainly made of gallium nitride (GaN) and contains, for example, silicon (Si), germanium (Ge) and oxygen (O) as the donor. In the description herein, the expression of "mainly made of" means containing 90% or higher as the molar fraction. The substrate 110 is also called second semiconductor layer. The donor concentration of the substrate 110 is preferably higher than the donor concentration of the semiconductor layer 125 described below and is set to be not lower than $6\times10^{17}$ cm$^{-3}$.

The semiconductor layer 125 of the semiconductor device 10 is an N-type semiconductor layer extended along the X axis and the Y axis. The semiconductor layer 125 is also called first semiconductor layer. The semiconductor layer 125 is stacked on the substrate 110 (more specifically, on the +Z-axis direction side). According to this embodiment, the semiconductor layer 125 is mainly made of gallium nitride (GaN) and contains silicon (Si) as the donor. According to this embodiment, the donor concentration of the semiconductor layer 125 is set in a range of $6\times10^{15}$ cm$^{-3}$ to $3\times10^{16}$ cm$^{-3}$.

The P-type semiconductor regions 122 and the N-type semiconductor regions 124 are alternately arranged either in the X-axis direction or in the Y-axis direction on one surface of the semiconductor layer 125 (more specifically, on the +Z-axis direction side). The P-type semiconductor region 122 and the N-type semiconductor region 124 are mainly made of gallium nitride (GaN). The P-type semiconductor region 122 contains magnesium (Mg) as the acceptor. The acceptor concentration of the P-type semiconductor region 122 is set in a range of $3.5\times10^{18}$ cm$^{-3}$ to $2\times10^{20}$ cm$^{-3}$. The N-type semiconductor region 124, on the other hand, contains silicon (Si) as the donor.

The donor concentration in an area R1 of the N-type semiconductor region 124 that is adjacent to and in contact with the semiconductor layer 125 is set to be lower than the donor concentration in an area R2 of the semiconductor layer 125 that is adjacent to and in contact with the N-type semiconductor region 124 and to be lower than the donor concentration in an area R3 of the N-type semiconductor region 124 that is adjacent to and in contact with the Schottky electrode 190 described later. In the description hereof, the expression of "the donor concentration in an area of A (for example, the semiconductor layer 125) that is adjacent to and in contact with B (for example, the N-type semiconductor region 124)" means an average donor concentration in an area of A from the interface between A and B to the depth of 0.1 μm.

With respect to a direction from the semiconductor layer 125 toward the Schottky electrode 190 of the semiconductor device 10 (i.e., with respect to the Z-axis direction), when the N-type semiconductor region 124 is divided into two equal parts, the average donor concentration in the Schottky electrode 190-side part of the N-type semiconductor region 124 is set to be higher than the average donor concentration in the semiconductor layer 125-side part of the N-type semiconductor region 124. According to this embodiment, when the N-type semiconductor region 124 is divided into two equal parts, the average donor concentration in the semiconductor layer 125-side part of the N-type semiconductor region 124 is set in a range of $1\times10^{14}$ cm$^{-3}$ to $5\times10^{15}$ cm$^{-3}$. When the N-type semiconductor region 124 is divided into two equal parts, the average donor concentration in the Schottky electrode 190-side part of the N-type semiconductor region 124 is set in a range of $4\times10^{16}$ cm$^{-3}$ to $5\times10^{17}$ cm$^{-3}$.

According to this embodiment, the surfaces of the P-type semiconductor regions 122 that are adjacent to and in contact with the semiconductor layer 125 and the surfaces of the N-type semiconductor regions 124 that are adjacent to and in contact with the semiconductor layer 125 are approximately flush with each other. In other words, with respect to the Z-axis direction, the difference between the thickness of the P-type semiconductor region 122 and the thickness of the N-type semiconductor region 124 is within 10% of the thickness of the P-type semiconductor region 122.

According to this embodiment, the P-type semiconductor regions 122 and the N-type semiconductor regions 124 have thicknesses W1 with respect to the Z-axis direction that are set in a range of 0.2 μm to 3.0 μm. The P-type semiconductor regions 122 have widths W2 with respect to the X-axis direction that are approximately equal to one another and are set in a range of 0.2 μm to 10.0 μm. Similarly the N-type semiconductor regions 124 have widths W3 with respect to the X-axis direction that are approximately equal to one another and are set in a range of 0.5 μm to 10.0 μm. The P-type semiconductor regions 122 and the N-type semiconductor regions 124 have depths with respect to the Y-axis direction that may be set arbitrarily and may be, for example, equal to the respective widths with respect to the X-axis direction.

The Schottky electrode 190 of the semiconductor device 10 is an electrode that has electrical conductivity and is in Schottky junction with the N-type semiconductor regions 124. The Schottky electrode 190 is arranged to be adjacent to and in contact with the P-type semiconductor regions 122 and the N-type semiconductor regions 124. The Schottky electrode 190 is stacked on the P-type semiconductor regions 122 and the N-type semiconductor regions 124 (more specifically, on the +Z-axis direction side). According to this embodiment, the Schottky electrode 190 is formed across and over the P-type semiconductor regions 122 and the N-type semiconductor regions 124.

The Schottky electrode 190 may include a nickel (Ni) layer, a palladium (Pd) layer and a molybdenum (Mo) layer that are arranged sequentially from the side that is adjacent to and in contact with the P-type semiconductor regions 122 and the N-type semiconductor regions 124. According to this embodiment, the nickel layer has a thickness of 100 nm, the palladium layer has a thickness of 100 nm, and the molybdenum layer has a thickness of 10 nm. The Schottky electrode 190 may, however, be not necessarily limited to the above configuration but may be any other electrode that is in Schottky junction with the N-type semiconductor regions 124. For example, palladium (Pd), nickel (Ni) and tungsten (W) may be employed as the material of the Schottky electrode 190. A metal layer made of another metal may additionally be provided on the Schottky electrode 190.

The rear face electrode 170 of the semiconductor device 10 is an electrode that is in ohmic contact with the −Z-axis direction side of the substrate 110 and is also called N-type ohmic electrode. In the description hereof, ohmic contact is different from Schottky junction and means a contact having a relatively low contact resistance. The rear face electrode 170 is provided on the opposite side to the Schottky electrode 190 with respect to the semiconductor layer 125. The rear face electrode 170 may include (i) a first titanium layer containing titanium (Ti), (ii) an aluminum layer containing aluminum (Al), (iii) a second titanium layer containing titanium (Ti), (iv) a titanium nitride layer containing titanium nitride (TiN), (v) a third titanium layer containing titanium (Ti) and (vi) a silver layer containing silver (Ag) that are arranged sequentially from the side that is adjacent to and in contact with the substrate 110. According to this embodiment, the first titanium layer has a thickness of 30 nm; the aluminum layer has a thickness of 300 nm; the second titanium layer has a thickness of 20 nm; the titanium nitride layer has a thickness of 200 nm; the third titanium layer has a thickness of 20 nm; and the silver layer has a thickness of 100 nm. The rear face electrode 170 may, however, be not necessarily limited to the above configuration but may be any other electrode that is in N-type ohmic contact with the substrate 110. For example, the rear face electrode 170 may include a titanium (Ti) layer, a nickel (Ni) layer and a gold (Au) layer that are arranged sequentially from the substrate 110-side. In another example, the rear face electrode 170 may include a titanium (Ti) layer and an aluminum (Al) layer that are arranged sequentially from the substrate 110-side.

A-2. Method of Manufacturing Semiconductor Device

Figure 2:
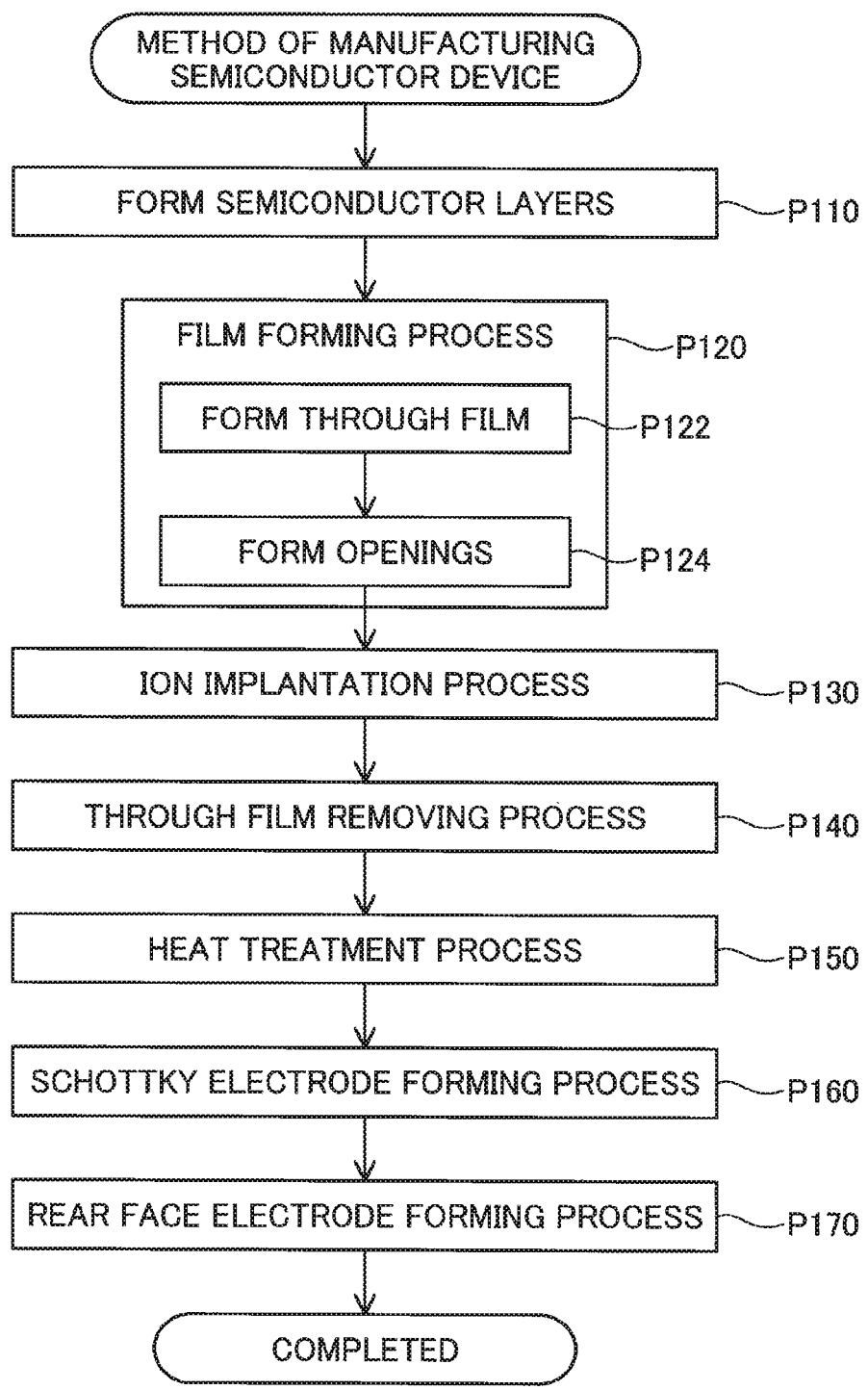
FIG. 2 is a process chart showing a method of manufacturing the semiconductor device.

FIG. 2 is a process chart showing a method of manufacturing the semiconductor device 10. In the process of manufacturing the semiconductor device 10, the manufacturer first forms the semiconductor layer 125 and a semiconductor layer 122A, which is later made to form either the P-type semiconductor region 122 or the N-type semiconductor region 124, on the substrate 110 at process P110. According to this embodiment, the manufacturer forms the semiconductor layers 125 and 122A on the substrate 110 by epitaxial growth using an MOCVD apparatus that implements metal organic chemical vapor deposition (MOCVD). The process P110 is also called semiconductor layer forming process. According to this embodiment, the semiconductor layer 125 that has the donor concentration of $6 \times 10^{15}$ cm$^{-3}$ to $3 \times 10^{16}$ cm$^{-3}$ and the semiconductor layer 122A that is a non-doped layer which is not intentionally doped with a donor or an acceptor are formed on the substrate 110.

After the semiconductor layer forming process (process P110), the manufacturer forms a through film 130 including openings 135 on the semiconductor layer 122A at process P120. The process P120 is also called film forming process. The process P120 includes a process of forming the through film 130 (process P122) and a process of forming the openings 135 in the through film 130 (process P124).

The manufacturer forms the through film 130 at process P122. The through film 130 is a film containing silicon (Si) and is also called silicon-containing film. It is preferable that the through film 130 contains at least one of silicon oxide (SiO$_2$) and silicon nitride (SiN). According to this embodiment, silicon oxide (SiO$_2$) is used as the material of the through film 130. According to this embodiment, the through film 130 is formed by chemical vapor deposition (CVD). Sputtering or atomic layer deposition (ALD) may alternatively be employed as the technique of forming the through film 130.

Figure 3:
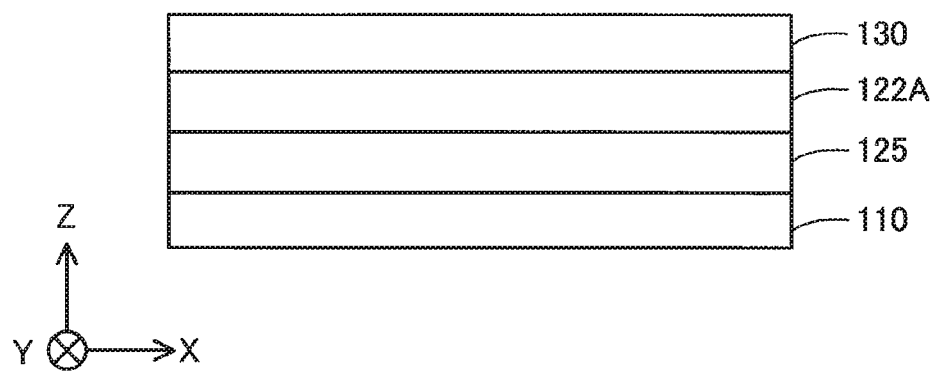
FIG. 3 is a schematic diagram illustrating the state that a through film is formed.

FIG. 3 is a schematic diagram illustrating the state that the through film 130 is formed. The through film 130 is used to implant an N-type impurity element that is included in the through film 130, into the semiconductor layer 122A by the knock-on effect during ion implantation performed in a later process. It is accordingly preferable that the thickness of the through film 130 is not less than 1 nm. It is also preferable that the thickness of the through film 130 is not greater than 100 nm, since the through film 130 is required to have a thickness that allows for transmission of an implanted ion in the process of ion implantation. According to this embodiment, the thickness of the through film 130 is 50 nm. The through film 130 is different from a mask for ion implantation that is used to prevent ion implantation into a semiconductor layer. The generally used mask for ion implantation causes an implanted ion species to be caught in the mask for ion implantation and prevents implantation of the implanted ion species into a semiconductor layer. The through film 130 is, on the other hand, set to have such a film thickness that causes the implanted ion species to be implanted into the semiconductor layer 122A.

The manufacturer subsequently forms the openings 135 in the through film 130 at process P124. More specifically, the manufacturer first applies a photoresist on the through film 130 and subsequently forms a photoresist film 140 that is patterned in a predetermined shape by exposure and development.

Figure 4:
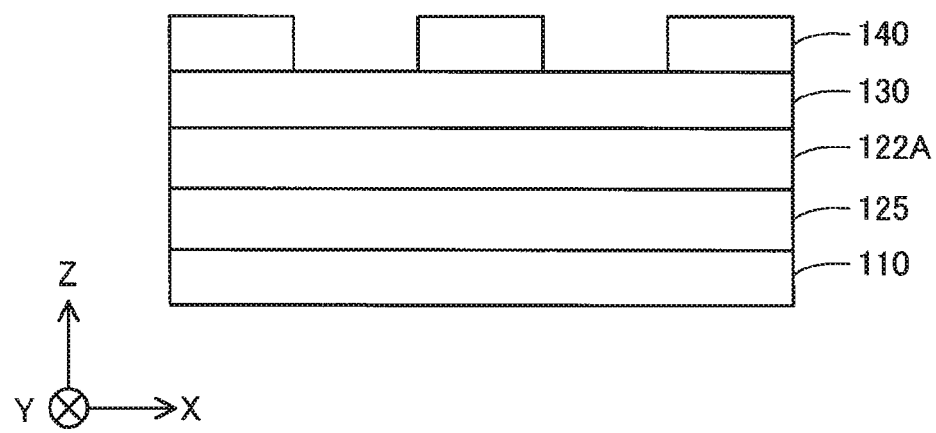
FIG. 4 is a schematic diagram illustrating the state that a patterned photoresist film is formed.

FIG. 4 is a schematic diagram illustrating the state that the patterned photoresist film 140 is formed. As shown in FIG. 4, the photoresist film 140 includes portions that cover the through film 130 and portions that cause the through film 130 to be exposed.

The manufacturer then forms the openings 135 in the through film 130 by etching a +Z-axis direction side face of the photoresist film 140 and a +Z-axis direction side face of the exposed through film 130. The etching technique employed may be dry etching such as RIE (reaction ion etching) or wet etching using BHF (buffered hydrofluoric acid) or HF (hydrofluoric acid).

Figure 5:
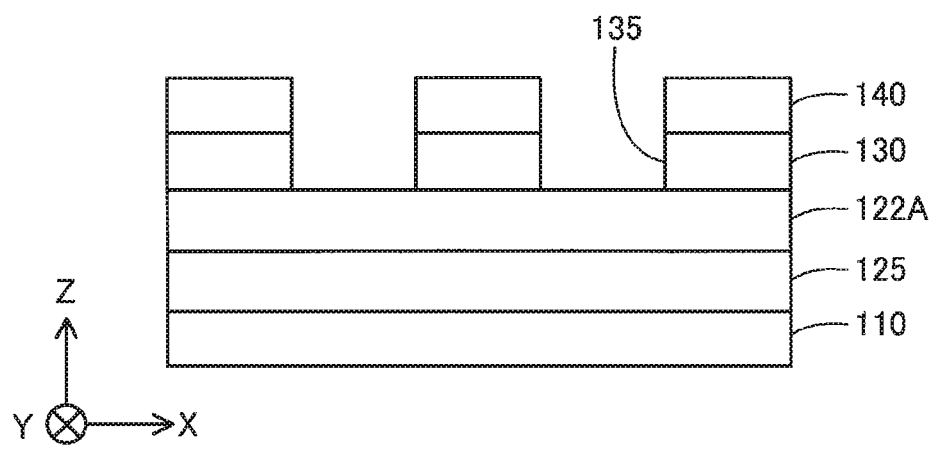
FIG. 5 is a schematic diagram illustrating the state that openings are formed in the through film.

FIG. 5 is a schematic diagram illustrating the state that the openings 135 are formed in the through film 130. The manufacturer strips off the photo resist film 140 by using a stripping solution. This completes the process of forming the openings 135 in the through film 130 (process P124) and thereby completes the film forming process (process P120).

In order to prevent ion implantation in regions that do not require ion implantation, for example, element isolation regions, a patterned mask for ion implantation may be formed on the through film 130 as appropriate. The mask for ion implantation is formed to have such a thickness that does not allow for transmission of an implanted ion species through the mask for ion implantation. Forming the mask for ion implantation results in forming regions in which no ion is implanted, in the semiconductor layer 122A. The film thickness of the mask for ion implantation is greater than the film thickness of the through film 130. The film thickness of the mask for ion implantation is generally set to be greater than the depth of ion implantation. For example, when the depth of ion implantation is 0.5 μm, the film thickness of the mask for ion implantation may be 1 μm that is twice the depth of ion implantation.

After the film forming process (process P120), the manufacturer performs ion implantation of a P-type impurity into the semiconductor layer 122A across the through film 130 at process P130. The process P130 is also called ion implantation process.

Figure 6:
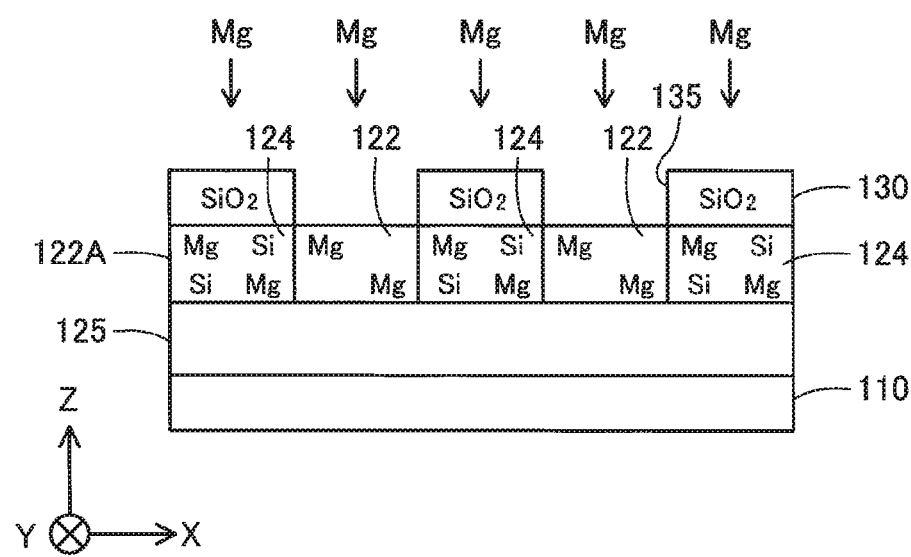
FIG. 6 is a schematic diagram illustrating the state of ion implantation.

FIG. 6 is a schematic diagram illustrating the state of ion implantation. The P-type impurity used may be, for example, magnesium (Mg), beryllium (Be) or zinc (Zn). According to this embodiment, magnesium (Mg) is used as the P-type impurity.

As shown in FIG. 6, in the regions of the semiconductor layer 122A that are subjected to ion implantation through the openings 135 formed in the through film 130, only magnesium (Mg) as the P-type impurity is implanted into the semiconductor layer 122A. In the regions of the semiconductor layer 122A that are subjected to ion implantation across the through film 130, on the other hand, silicon (Si) that is included in the through film 130 is implanted into the semiconductor layer 122A, along with implantation of magnesium (Mg) as the P-type impurity into the semiconductor layer 122A. The reason for implantation of silicon (Si) that is included in the through film 130 into the semiconductor layer 122A may be attributed to that magnesium (Mg) collides with silicon (Si) included in the through film 130 and the collided silicon (Si) is then implanted into the semiconductor layer 122A by the known-on effect. The rate of implantation of silicon (Si) into the semiconductor layer 122A is approximately one tenth to one hundredth of the rate of implantation of magnesium (Mg) as the P-type impurity into the semiconductor layer 122A.

In the ion implantation process (process P130), the N-type semiconductor regions 124 are formed in the part of the semiconductor layer 122A that is subjected to ion implantation across the through film 130. The P-type semiconductor regions 122 are, on the other hand, formed in the part of the semiconductor layer 122A that is subjected to ion implantation through the openings 135. Accordingly, the N-type semiconductor regions 124 with ion implantation of magnesium (Mg) and silicon (Si) and the P-type semiconductor regions 122 with ion implantation of only magnesium (Mg) are formed on the semiconductor layer 125. Because of ion implantation of silicon (Si) from the through film 130 into the N-type semiconductor regions 124, the concentration of silicon (Si) in a surface layer of the N-type semiconductor regions 124 becomes higher than the concentration of silicon (Si) in a surface layer of the P-type semiconductor regions 122.

After the ion implantation process (process P130), the manufacturer removes the through film 130 at process P140. The process P140 is also called through film removing process.

Figure 7:
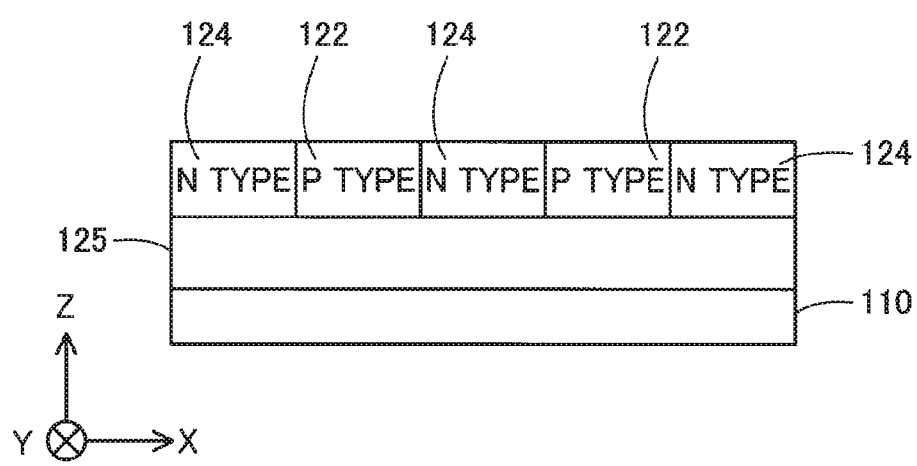
FIG. 7 is a schematic diagram illustrating the state that the through film is removed.

FIG. 7 is a schematic diagram illustrating the state that the through film 130 is removed. According to this embodiment, the through film 130 is removed by wet etching. For example, BHF (buffered hydrofluoric acid) or HF (hydrofluoric acid) may be used as an etchant of wet etching.

After the through film removing process (process P140), the manufacturer processes the N-type semiconductor regions 124 and the P-type semiconductor regions 122 by heat treatment at process P150. The process P150 is also called heat treatment process. This heat treatment process (process P150) activates the impurities implanted into the semiconductor layer 122A by ion implantation. More specifically, the heat treatment process moves the implanted impurities to adequate lattice positions in the semiconductor layer 122A and simultaneously recovers the damage of the semiconductor layer 122A caused by ion implantation. This causes silicon (Si) to serve as the donor and magnesium (Mg) to serve as the acceptor.

The heat treatment temperature is preferably not lower than 900° C., in terms of more certainly activating the impurities. In terms of suppressing nitrogen (N) from being removed from the P-type semiconductor regions 122 and the N-type semiconductor regions 124, the heat treatment temperature is preferably not higher than 1200° C., and heat treatment is preferably performed in an atmosphere including ammonia ($NH_3$). Prior to the heat treatment process (process P150), it is preferable to form a protective film in advance on the P-type semiconductor regions 122 and the N-type semiconductor regions 124. This suppresses the surface of the P-type semiconductor regions 122 and the N-type semiconductor regions 124 from being roughed during heat treatment. The material used for the protective film may be, for example, aluminum nitride (AlN). When the protective film is formed, the manufacturer removes the protective film after the heat treatment. For example, when aluminum nitride (AlN) is used for the protective film, the manufacturer may remove the protective film by wet etching using, for example, tetramethylammonium hydroxide (TMAH).

After the heat treatment process (process P150), the manufacturer forms the N-type Schottky electrode 190 that is in contact with across the N-type semiconductor regions 124 and the P-type semiconductor regions 122 at process P160. The process P160 is also called Schottky electrode forming process.

According to this embodiment, the manufacturer (a) forms a nickel layer by mainly using nickel (Ni) on the N-type semiconductor regions 124 and the P-type semiconductor regions 122, (b) forms a palladium layer by mainly using palladium (Pd) on the nickel layer, and (c) forms a molybdenum layer by mainly using molybdenum (Mo) on the palladium layer. According to this embodiment, vapor deposition is employed to form the Schottky electrode 190. This technique is, however, not essential, and sputtering may be employed.

After the Schottky electrode forming process (process P160), the manufacturer forms the rear face electrode 170 on the −Z-axis direction side face of the substrate 110 at process P170. The process P170 is also called rear face electrode forming process.

According to this embodiment, the manufacturer sequentially forms the first titanium layer, the aluminum layer, the second titanium layer, the titanium nitride layer, the third titanium layer and the silver layer from the −Z-axis direction side of the substrate 110. According to this embodiment, vapor deposition is employed to form the rear face electrode 170. This technique is, however, not essential, and sputtering may be employed.

The semiconductor device 10 is completed by the above series of processes.

A-3. Mechanism

In the method of manufacturing the semiconductor device 10 according to the embodiment, the P-type semiconductor regions 122 and the N-type semiconductor regions 124 are formed in the semiconductor layer 122A by the ion implantation process (process P130). The following describes in detail the mechanism of forming the P-type semiconductor regions 122 and the N-type semiconductor regions 124 in the semiconductor layer 122A by the ion implantation process (process P130).

In general, in a semiconductor layer formed from silicon (Si) or silicon carbide (SiC), the activation rate of a P-type impurity is approximately equal to the activation rate of an N-type impurity. These activation rates of both the impurities are high rates. Even when part of the constitute elements of the through film is the N-type impurity, the rate of implantation of this N-type impurity into the semiconductor layer is as low as approximately one tenth to one hundredth of the rate of implantation of the P-type impurity into the semiconductor layer. Accordingly the constituent elements of the through film hardly affect formation of the P-type semiconductor regions.

The activation rate of the N-type impurity in a semiconductor layer formed from gallium nitride (GaN) is high and is approximately equal to the activation rate in the semiconductor layer formed from silicon (Si) or silicon carbide (SiC). As described in JP 2014-110310A, however, the activation rate of the P-type impurity is extremely low in the semiconductor layer formed from gallium nitride (GaN). More specifically, in the process of ion implantation, the activation rate of the P-type impurity is approximately one hundredth to one two-hundredth of the activation rate of the N-type impurity. Accordingly the N-type impurity has an extremely large effect on the semiconductor layer formed from gallium nitride (GaN) in the process of ion implantation. When the N-type impurity is included in the constituent elements of the through film 130, in the process of ion implantation of the P-type impurity, an N-type region is likely to be formed unintentionally by the effect of the N-type impurity that is implanted from the through film 130 into the semiconductor layer 122A by the knock-on effect.

FIGS. 8(A) and 8(B) and FIGS. 9(A) and 9(B) show concentration distributions in an A-A section and in a B-B section of the MPS diode that is manufactured by the above manufacturing method and is shown in FIG. 1.

A-4. Concentration Distributions

Figure 8:
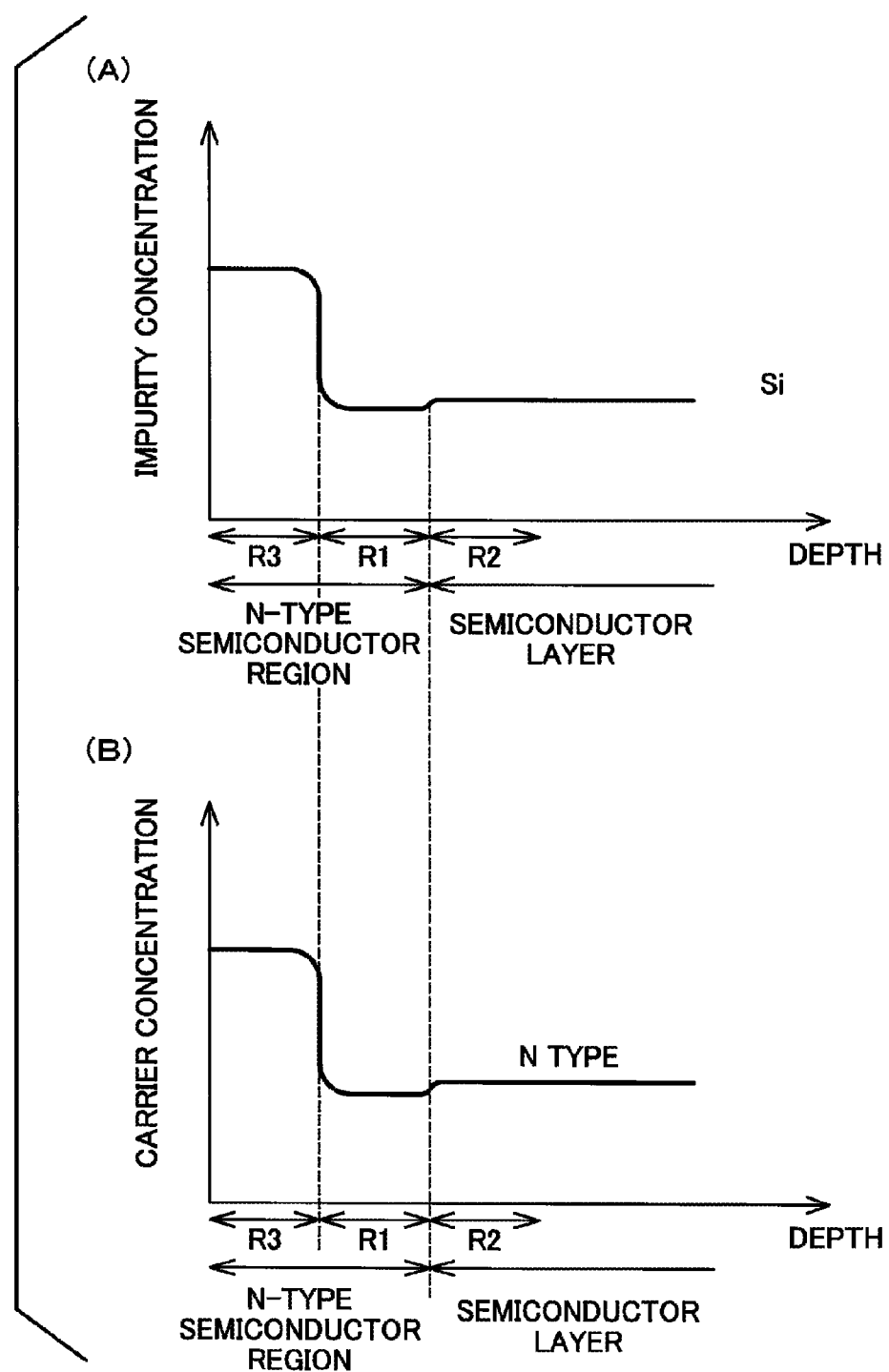
FIG. 8 is a diagram showing variations in concentrations relating to a carrier in sections of an N-type semiconductor region and a semiconductor layer.

FIG. 8 is a diagram showing a variation of the impurity concentration and a variation of the carrier concentration in the sections of the N-type semiconductor region 124 and the semiconductor layer 125 included in the A-A section of FIG. 1. The abscissa axes of FIGS. 8(A) and 8(B) show the depth (pan) in the −Z-axis direction of the N-type semiconductor region 124 and the semiconductor layer 125. The depth of 0 μm indicates the interface between the N-type semiconductor region 124 and the Schottky electrode 190. The ordinate axes of both FIGS. 8(A) and 8(B) employ the logarithmic expression. The ordinate axis of FIG. 8(A) shows the impurity concentration, and the ordinate axis of FIG. 8(B) shows the carrier concentration.

As shown in FIG. 8(A), the donor (impurity) concentration in the area R1 of the N-type semiconductor region 124 that is adjacent to and in contact with the semiconductor layer 125 is set to be lower than the donor concentration in the area R2 of the semiconductor layer 125 that is adjacent to and in contact with the N-type semiconductor region 124 and to be lower than the donor concentration in the area R3 of the N-type semiconductor region 124 that is adjacent to and in contact with the Schottky electrode 190.

As shown in FIG. 8(A), the donor concentration is kept approximately constant in each of the areas R1, R2 and R3. In the description hereof, the expression of "concentration is kept approximately constant" means that the concentration is within ±10 times. As shown in FIG. 8(A), with respect to the Z-axis direction (depth direction) of the semiconductor device 10, when the N-type semiconductor region 124 is divided into two equal parts, the average donor concentration in the Schottky electrode 190-side part of the N-type semiconductor region 124 is set to be higher than the average donor concentration in the semiconductor layer 125-side part of the N-type semiconductor region 124.

The donor concentration in the N-type semiconductor region 124 is kept constant or is gradually decreased with an increase in the depth, i.e., from the Schottky electrode 190-side toward the semiconductor layer 125-side. In other words, the N-type semiconductor region 124 includes no area in which the donor concentration is increased from the Schottky electrode 190-side toward the semiconductor layer 125-side in FIG. 8(A).

FIG. 8(B) shows a variation of the carrier concentration. In general, when the acceptor concentration in a semiconductor layer is sufficiently lower than the donor concentration, a distribution of the donor concentration substantially conforms with a distribution of the electron concentration (distribution of the carrier concentration). When ion implantation is employed to dope the semiconductor layer with an impurity like the manufacturing method of this embodiment, however, the acceptor and the donor are likely to coexist in the semiconductor layer. In the case where the acceptor and the donor coexist, due to the effect of the acceptor, the distribution of the carrier concentration may not be specified by only the donor concentration. In this case, a concentration calculated by subtracting the hole concentration released by the acceptor from the electron concentration released from the donor indicates an N-type carrier concentration. It is preferable to dope the semiconductor layer with an impurity such that this calculated value provides the variation of the carrier concentration shown in FIG. 8(B). A P-type carrier concentration, on the other hand, denotes a concentration calculated by subtracting the electron concentration released from the donor from the hole concentration released by the acceptor.

In the above description, the characteristic of the N-type semiconductor region 124 is specified by the donor concentration in the N-type semiconductor region 124. The characteristic of the N-type semiconductor region is also specified by the carrier concentration in the N-type semiconductor region 124 as described below. The N-type carrier concentration in the area R1 of the N-type semiconductor region 124 that is adjacent to and in contact with the semiconductor layer 125 is set to be lower than the N-type carrier concentration in the area R2 of the semiconductor layer 125 that is adjacent to and in contact with the N-type semiconductor region 124 and to be lower than the N-type carrier concentration in the area R3 of the N-type semiconductor region 124 that is adjacent to and in contact with the Schottky electrode 190. With respect to the Z-axis direction, when the N-type semiconductor region 124 is divided into two equal parts, the average N-type carrier concentration in the Schottky electrode 190-side part of the N-type semiconductor region 124 is set to be higher than the average N-type carrier concentration in the semiconductor layer 125-side part of the N-type semiconductor region 124. The N-type carrier concentration is kept approximately constant in each of the areas R1, R2, and R3. The N-type carrier concentration in the N-type semiconductor region 124 is kept constant or is gradually decreased with an increase in the depth, i.e., from the Schottky electrode 190-side toward the semiconductor layer 125-side.

Figure 9:
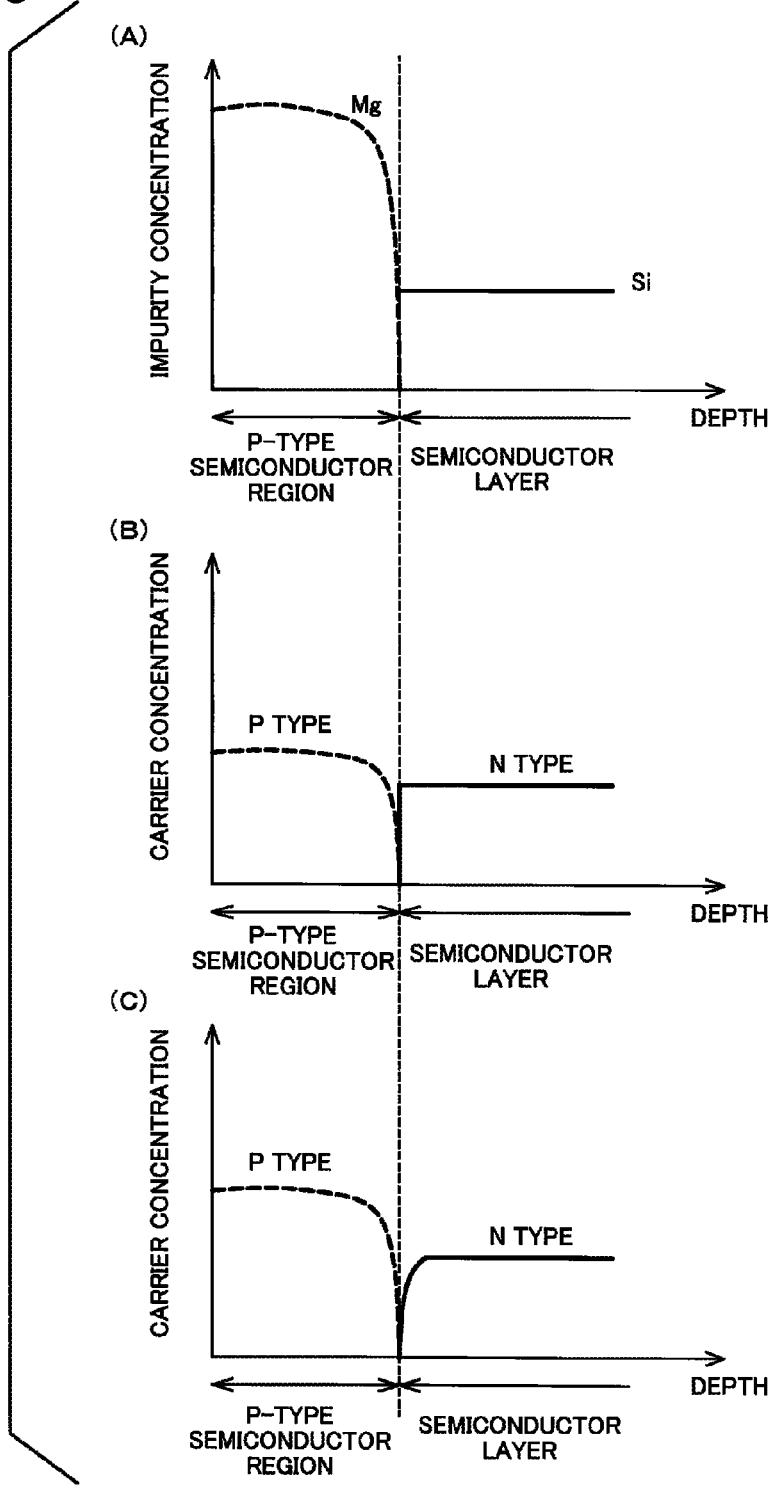
FIG. 9 is a diagram showing variations in concentrations relating to the carrier in sections of a P-type semiconductor region and the semiconductor layer.

FIG. 9 is a diagram showing a variation of the impurity concentration and variations of the carrier concentration in the sections of the P-type semiconductor region 122 and the semiconductor layer 125 included in the B-B section of FIG. 1. The abscissa axes of FIGS. 9(A), 9(B) and 9(C) show the depth (μm) in the −Z-axis direction of the P-type semiconductor region 122 and the semiconductor layer 125. The depth of 0 μm indicates the interface between the P-type semiconductor region 122 and the Schottky electrode 190. The ordinate axes of all FIGS. 9(A), 9(B) and 9(C) employ the logarithmic expression. The ordinate axis of FIG. 9(A) shows the impurity concentration, and the ordinate axes of FIG. 9(B) and FIG. 9(C) show the carrier concentration.

In FIG. 9(A), a variation in the concentration of magnesium (Mg) is shown by a broken line curve, and a variation in the concentration of silicon (Si) is shown by a solid line curve. As shown in FIG. 9(A), the P-type semiconductor region 122 is doped with magnesium (Mg) as the acceptor, and the semiconductor layer 125 is doped with silicon (Si) as the donor. As shown in FIG. 9(B), a P-type carrier is formed in the P-type semiconductor region 122, and an N-type carrier is formed in the semiconductor layer 125. A depletion layer by PN junction is formed in the vicinity of the interface between the P-type semiconductor region 122 and the semiconductor layer 125. Accordingly there is an area of low carrier concentration in the vicinity of the interface between the P-type semiconductor region 122 and the semiconductor layer 125.

The activation rate of magnesium in gallium nitride (GaN) is approximately one hundredth and is significantly lower than the activation rate of silicon that is not lower than eight tenths. Accordingly it is preferable to set the concentration of magnesium (Mg) in the P-type semiconductor region 122 to be not lower than 100 times the concentration of silicon (Si) in the semiconductor layer 125.

As shown in FIG. 9(A), in the semiconductor device 10 of the embodiment, the acceptor (P-type impurity) concentration in the semiconductor layer 125-side of the P-type semiconductor region 122 is set to be lower than the acceptor concentration in the Schottky electrode 190-side of the P-type semiconductor region 122. As shown in FIG. 9(B), the depletion layer accordingly spreads on the P-type semiconductor region 122-side with respect to the interface between the P-type semiconductor region 122 and the semiconductor layer 125. An increase in the acceptor concentration in the P-type semiconductor region 122 causes the depletion layer to spread on the semiconductor layer 125-side with respect to the interface between the P-type semiconductor region 122 and the semiconductor layer 125.

FIG. 9(C) shows a variation of the carrier concentration in a more preferable state than the state shown in FIG. 9(B). More specifically, in the state of FIG. 9(C), the concentration of magnesium (Mg) in the P-type semiconductor region 122 is set to be higher than 100 times the concentration of silicon (Si) in the semiconductor layer 125. Setting the concentration of magnesium (Mg) in the P-type semiconductor region 122 to be higher than 100 times the concentration of silicon (Si) in the semiconductor layer 125 causes the concentration of ionized magnesium (Mg), i.e., the activated acceptor concentration, to be higher than the concentration of ionized silicon (Si). As a result, as shown in FIG. 9(C), the depletion layer spreads on the semiconductor layer 125-side with respect to the interface between the P-type semiconductor region 122 and the semiconductor layer 125. Accordingly, under applying a reverse bias voltage, in PN junction between the P-type semiconductor region 122 and the semiconductor layer 125, the depletion layer selectively spreads on the semiconductor layer 125-side with respect to the interface between the P-type semiconductor region 122 and the semiconductor layer 125. This further improves the breakdown voltage.

With respect to the Z-axis direction, it is preferable that the average acceptor concentration in the P-type semiconductor region 122 is higher than the average donor concentration in the semiconductor layer 125-side part of the N-type semiconductor region 124 when the N-type semiconductor region 124 is divided into two equal parts (as shown in FIG. 1). This causes a depletion layer formed between the P-type semiconductor region 122 and the N-type semiconductor region 124 to selectively spread on the N-type semiconductor region 124-side with respect to the interface between the P-type semiconductor region 122 and the N-type semiconductor region 124. Under applying a reverse bias voltage, this enables Shottky junction between the N-type semiconductor region 124 and the Schottky electrode 190 to be effectively protected by the depletion layer. As a result, this further improves the breakdown voltage under applying a reverse bias voltage.

A-5. Advantageous Effects of Embodiment

In the semiconductor device 10 of the embodiment, the donor concentration in the area R1 of the N-type semiconductor region 124 that is adjacent to and in contact with the semiconductor layer 125 (shown in FIG. 1) is lower than the donor concentration in the area R2 of the semiconductor layer 125 that is adjacent to and in contact with the N-type semiconductor region 124 and is also lower than the donor concentration in the area R3 of the N-type semiconductor region 124 that is adjacent to and in contact with the Schottky electrode 190. This concentration distribution reduces a rising voltage under applying a forward bias voltage. This accordingly results in improving the efficiency as the power conversion apparatus. This improves the breakdown voltage, on the other hand, under applying a reverse bias voltage. This mechanism is described below.

Figure 10:
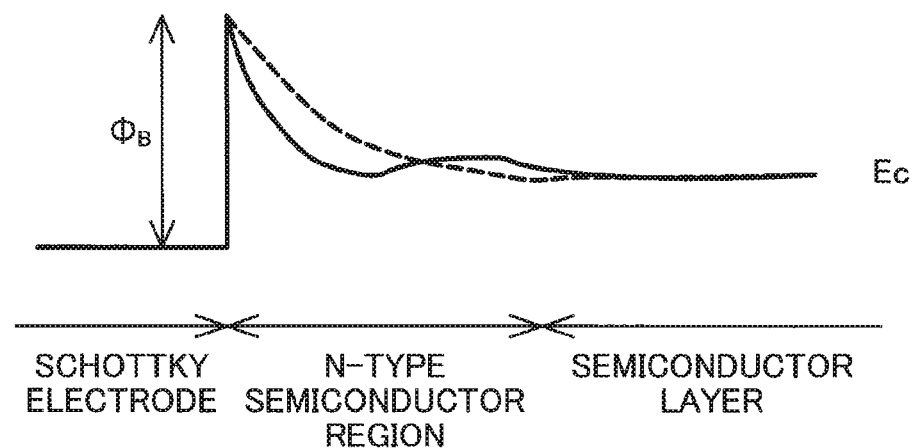
FIG. 10 shows profiles of Ec (energy at the lower end of a conduction band)
Figure 11:
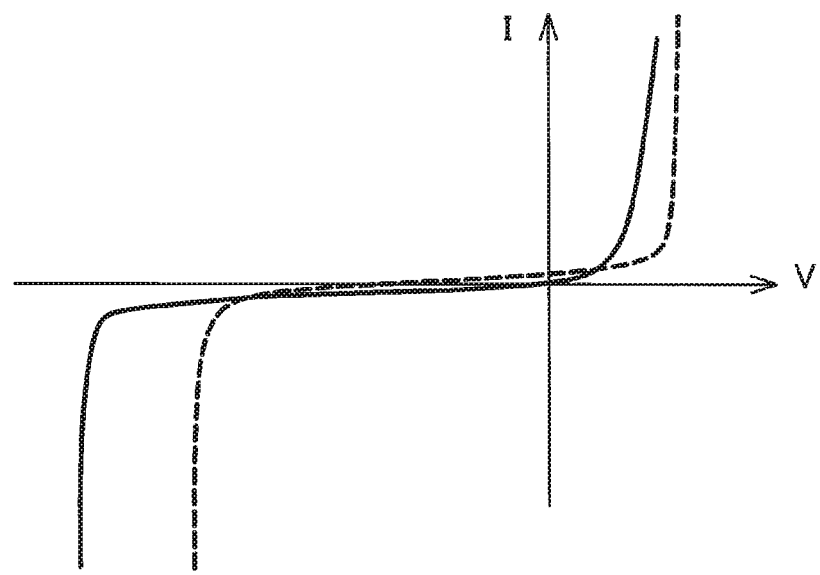
FIG. 11 is a diagram illustrating the effect under applying a forward bias voltage.

FIGS. 10 and 11 are diagrams illustrating the effect under applying a forward bias voltage. In general, when a forward bias voltage is applied to an MPS diode, a rising voltage in Schottky junction is lower than a rising voltage in PN junction. The effect under applying a forward bias voltage is accordingly described below with focusing attention on the Schottky junction.

FIG. 10 shows profiles of Ec (energy at the lower end of a conduction band) in the Schottky electrode 190, the N-type semiconductor region 124 and the semiconductor layer 125 included in the A-A section of FIG. 1. The configuration that the N-type semiconductor region 124 has a uniform distribution of the donor concentration provides a broken-line profile of Ec. According to the embodiment, on the other hand, the donor concentration in the area R1 of the N-type semiconductor region 124 that is adjacent to and in contact with the semiconductor layer 125 (shown in FIG. 1) is lower than the donor concentration in the area R3 of the N-type semiconductor region 124 that is adjacent to and in contact with the Schottky electrode 190. Accordingly the configuration of this embodiment provides a solid-line profile of Ec. Compared with the broken-line profile, the solid-line profile decreases the width of the Schottky barrier and more specifically decreases the width of the Schottky barrier significantly in an upper portion of the Schottky barrier. Accordingly, the configuration of this embodiment decreases the effective height φB of the Schottky barrier. As a result, this reduces the rising voltage under applying a forward bias voltage.

FIG. 11 is a diagram showing variations of current-voltage characteristic. The abscissa axis shows voltage V, and the ordinate axis show current I. The positive side on the abscissa axis indicates a forward bias voltage. A broken line curve shows a current-voltage characteristic in the configuration that the P-type semiconductor region 122 has a uniform distribution of the donor concentration (corresponding to the broken-line profile shown in FIG. 10). A solid line curve shows a current-voltage characteristic in the configuration of this embodiment (corresponding to the solid-line profile shown in FIG. 10). As clearly shown in FIG. 11, under applying a forward bias voltage, the rising voltage in the configuration of this embodiment is lower than the rising voltage in the configuration that the P-type semiconductor region 122 has a uniform distribution of the donor concentration. Accordingly, using the diode of the embodiment for an inverter further reduces a power loss.

Figure 12:
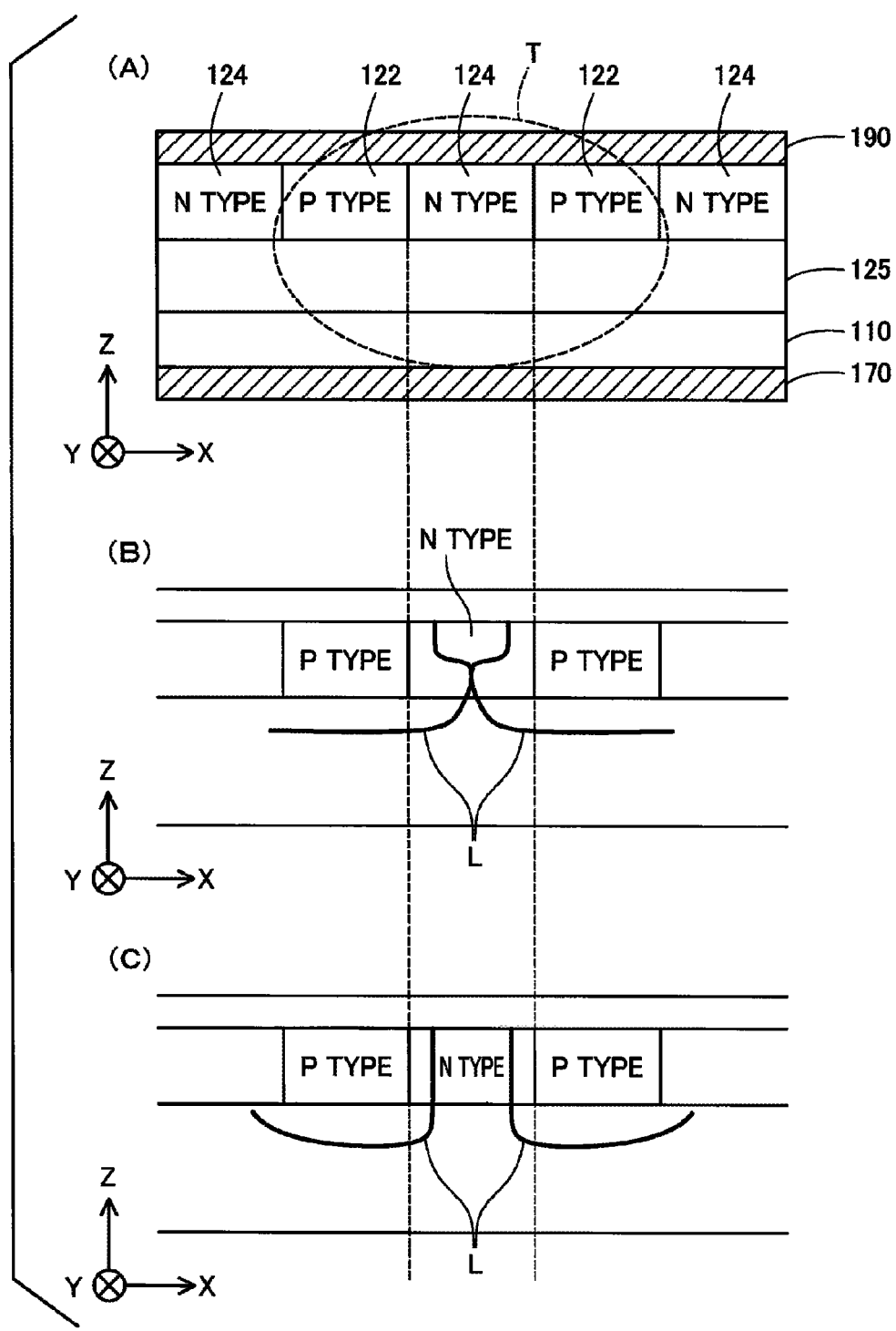
FIG. 12 is a schematic diagram illustrating the effect under applying a reverse bias voltage.

FIGS. 12(A), 12(B) and 12(C) are schematic diagrams illustrating the effect under applying a reverse bias voltage. FIG. 12(A) is a schematic diagram illustrating the semiconductor device 10 of the embodiment. FIGS. 12(B) and 12(C) are schematic diagrams illustrating the spreads of a depletion layer in an area T shown in FIG. 12(A). Solid lines L indicate the spreads of a depletion layer spreading from a P-type semiconductor toward an N-type semiconductor. FIG. 12(C) shows the spread of a depletion layer in the configuration that the N-type semiconductor region 124 has a uniform distribution of the donor concentration. FIG. 12(B) shows the spread of a depletion layer in the configuration of this embodiment. According to this embodiment, the donor concentration in the area R1 of the N-type semiconductor region 124 that is adjacent to and in contact with the semiconductor layer 125 (shown in FIG. 1) is lower than the donor concentration in the area R3 of the N-type semiconductor region 124 that is adjacent to and in contact with the Schottky electrode 190. In the rear face electrode 170-side of the N-type semiconductor region 124, the donor concentration is accordingly low, and a depletion layer spreads at a lower voltage. As a result, as shown in FIG. 12(B), this causes the Schottky junction formed between the N-type semiconductor region 124 and the Schottky electrode 190 to be covered by the depletion layer. This accordingly enables the Schottky junction to be effectively protected by the depletion layer.

According to this embodiment, the donor concentration in the area R1 of the N-type semiconductor region 124 that is adjacent to and in contact with the semiconductor layer 125 (shown in FIG. 1) is also lower than the donor concentration in the area R2 of the semiconductor layer 125 that is adjacent to and in contact with the N-type semiconductor region 124. This causes a depletion layer to selectively spread on the N-type semiconductor region 124-side rather than on the semiconductor layer 125-side. As a result, a depletion layer spreads in the N-type semiconductor region 124 even under applying a relatively small reverse bias voltage. This causes the Schottky junction formed between the N-type semiconductor region 124 and the Schottky electrode 190 to be covered by the depletion layer and thus enables the Schottky junction to be effectively protected by the depletion layer.

According to this embodiment, the N-type semiconductor region 124 includes no area in which the concentration of silicon (Si) as the donor increases toward the −Z-axis direction side. This causes a depletion layer to spread smoothly and uniformly under applying a bias voltage. This accordingly enables the Schottky junction to be effectively protected by the depletion layer. As a result, more effective protection of the Schottky junction by the depletion layer improves the breakdown voltage under applying a reverse bias voltage.

As shown in FIG. 12(C), the configuration that the N-type semiconductor region 124 has a uniform distribution of the donor concentration, on the other hand, causes a depletion layer to spread in a constant width. As a result, applying a large reverse bias voltage is required to cause the Schottky junction to be protected by the depletion layer. Compared with the configuration that the N-type semiconductor region 124 has a uniform distribution of the donor concentration, the configuration of this embodiment thus enables the Schottky junction to be more effectively protected by the depletion layer and improves the breakdown voltage. The configuration that the P-type semiconductor region 122 has a uniform distribution of the donor concentration provides the current-voltage characteristic shown by the broken line in FIG. 11. FIG. 11 also shows that the configuration of the embodiment improves the breakdown voltage, compared with the configuration that the P-type semiconductor region 122 has a uniform distribution of the donor concentration.

B. Second Embodiment

Figure 13:
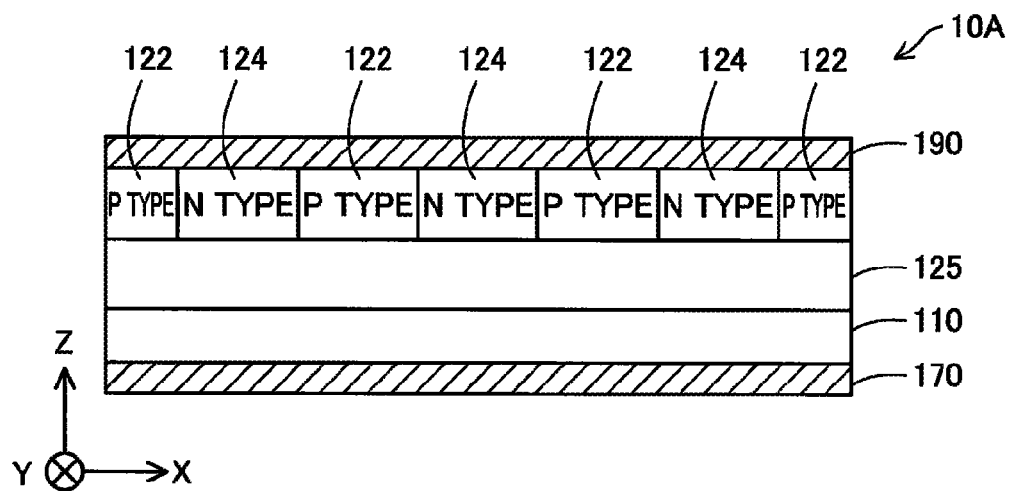
FIG. 13 is a sectional view schematically illustrating the structure of a semiconductor device according to a second embodiment.

FIG. 13 is a sectional view schematically illustrating the structure of a semiconductor device 10A according to a second embodiment. In the semiconductor device 10 of the first embodiment, the N-type semiconductor regions 124 are arranged at respective ends of the array of the P-type semiconductor regions and the N-type semiconductor regions arranged alternately. In the semiconductor device 10A of the second embodiment, however, the P-type semiconductor regions 122 are arranged at these ends. Otherwise the semiconductor device 10A of the second embodiment has a configuration similar to that of the semiconductor device 10 of the first embodiment.

According to this embodiment, the semiconductor device 10A includes four P-type semiconductor regions 122 and three N-type semiconductor regions 124. The numbers of the P-type semiconductor regions 122 and the N-type semiconductor regions 124 are, however, not limited to these numbers and may be any numbers.

According to this embodiment, the P-type semiconductor regions 122 are arranged at the respective ends in the X-axis direction. This configuration causes even the N-type semiconductor region 124 close to each end in the X-axis direction of the semiconductor device 10A to be protected by a depletion layer. This improves the breakdown voltage even at the respective ends in the X-axis direction of the semiconductor device 10A.

C. Third Embodiment

Figure 14:
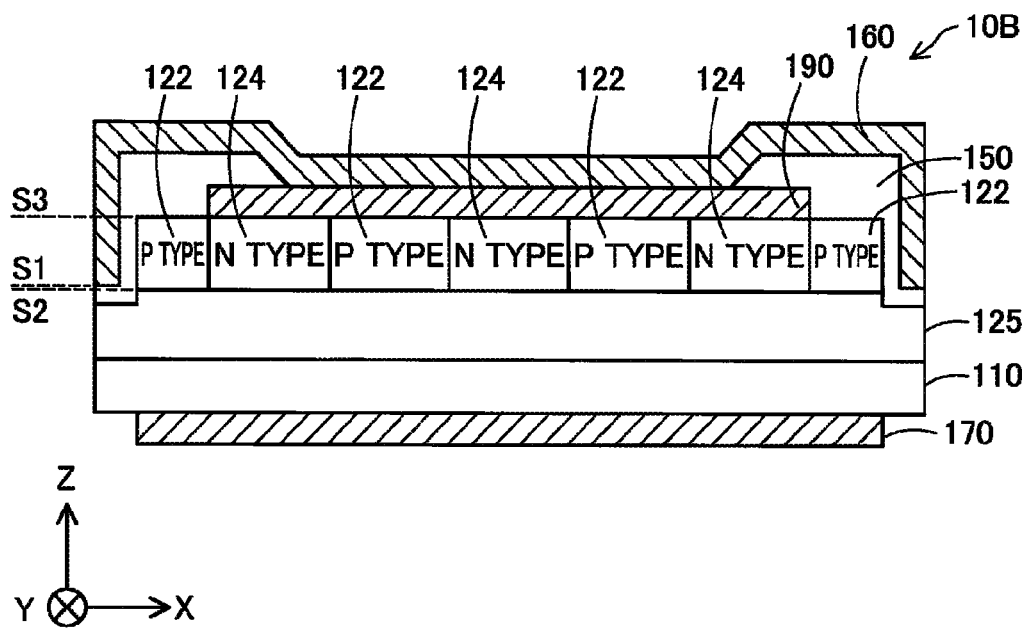
FIG. 14 is a sectional view schematically illustrating the structure of a semiconductor device according to a third embodiment.

FIG. 14 is a sectional view schematically illustrating the structure of a semiconductor device 10B according to a third embodiment. The semiconductor device 10B of the third embodiment differs from the semiconductor device 10A of the second embodiment by that the semiconductor device 10B employs the field plate structure. More specifically, a field plate electrode 160 is formed via an insulation film 150 provided at the ends of PN junction interfaces between P-type semiconductor regions 122 and a semiconductor layer 125 at respective ends in the X-axis direction of the semiconductor device 10B. In other words, the semiconductor device 10B includes the field plate electrode 160 that is electrically connected with the Schottky electrode 190 and is provided to cover the P-type semiconductor regions 122 arranged at the respective ends via the insulation film 150. According to this embodiment, the insulation film 150 is made of silicon oxide ($SiO_2$), and the field plate electrode 160 is made of aluminum (Al). The configuration of this embodiment suppresses the potential crowding at the ends of the PN junction interfaces and thereby improves the breakdown voltage at the respective ends in the X-axis direction of the semiconductor device 10B.

With respect to the Z-axis direction, a lowermost surface S1 (most semiconductor layer 125-side surface) of the field plate electrode 160 is located above (on the Schottky electrode 190-side of) a surface S2 of the P-type semiconductor region 122 that is adjacent to and in contact with the semiconductor layer 125 and is located below (on the semiconductor layer 125-side of) a surface S3 of the N-type semiconductor region 124 that is adjacent to and in contact with the Schottky electrode 190. This configuration accelerates depletion in the P-type semiconductor regions 122 arranged at the respective ends, thereby reducing the leak current in voltage breakdown and improving the breakdown voltage. The material used for the insulating film 150 may be, for example, silicon nitride (SiN) or aluminum oxide ($Al_2O_3$). The material used for the field plate electrode 160 may be, for example, aluminum silicon (AlSi), aluminum silicon copper (AlSiCu) or copper (Cu).

D. Modifications

FIGS. 15(A), 15(B) and 15(C) are diagrams showing variations in concentrations relating to the carrier in the sections of the N-type semiconductor region 124 and the semiconductor layer 125 according to modifications. The diagrams of FIG. 15 correspond to the diagrams showing the variations in the concentrations relating to the carrier in the A-A section of the first embodiment (shown in FIGS. 8(A) and 8(B)). The ordinate axes of all FIGS. 15(A), 15(B) and 15(C) employ the logarithmic expression. The ordinate axis of FIG. 15(A) shows the impurity concentration of Modification 1, and the ordinate axis of FIG. 15(B) shows the carrier concentration of Modification 1. The ordinate axis of FIG. 15(C) shows the impurity concentration of Modification 2 that is different from Modification 1. The abscissa axes of FIGS. 15(A), 15(B) and 15(C) show the depth (μm) in the −Z-axis direction of the N-type semiconductor region 124 and the semiconductor layer 125. The depth of 0 μm indicates the interface between the N-type semiconductor region 124 and the Schottky electrode 190.

As shown in FIGS. 15(A) and 15(B), the impurity concentration and the carrier concentration in the N-type semiconductor region 124 decrease not in a stepwise manner but continuously with an increase in the depth. In other words, the donor (impurity) concentration in the N-type semiconductor region 124 is kept constant or is gradually decreased from the Schottky electrode 190-side toward the semiconductor layer 125-side. Such setting of the impurity concentration and the carrier concentration causes a depletion layer to uniformly spread under applying a reverse bias voltage. This enables the Schottky junction to be protected by the depletion layer and improves the breakdown voltage.

Like Modification 2 shown in FIG. 15(C), the donor concentration may be constant with respect to the Z-axis direction (depth direction) in a partial area of the N-type semiconductor region 124. In other words, the donor concentration in the N-type semiconductor region 124 may be kept constant or gradually decreased from the Schottky electrode 190-side toward the semiconductor layer 125-side.

E. Other Embodiments

The disclosure is not limited to any of the embodiments and the modifications described above but may be implemented by a diversity of other configurations without departing from the scope of the disclosure. For example, the technical features of any of the embodiments and the modifications corresponding to the technical features of each of the aspects described in SUMMARY may be replaced or combined appropriately, in order to solve part or all of the problems described above or in order to achieve part or all of the advantageous effects described above. Any of the technical features may be omitted appropriately unless the technical feature is described as essential herein.

The manufacturing method described above forms the semiconductor layer 122A that is the non-doped layer on the semiconductor layer 125. The disclosure is, however, not limited to this configuration. According to another embodiment, the manufacturing method may form a semiconductor layer that has a lower donor concentration than the donor concentration of the semiconductor layer 125, in place of the semiconductor layer 122A, on the semiconductor layer 125. According to another embodiment, the manufacturing method may form a P-type semiconductor layer, in place of the semiconductor layer 122A, on the semiconductor layer 125, form a photoresist on areas of the P-type semiconductor layer that are supposed to form the P-type semiconductor regions 122, and implant silicon (Si) ion into remaining areas of the P-type semiconductor layer that are supposed to form the N-type semiconductor regions 124.

In the embodiments described above, the Schottky electrode 190 includes a nickel (Ni) layer, a palladium (Pd) layer and a molybdenum (Mo) layer arranged sequentially from the side that is adjacent to and in contact with the P-type semiconductor regions 122 and the N-type semiconductor regions 124. The disclosure is, however, not limited to this configuration. According to another embodiment, the Schottky electrode 190 may include a palladium (Pd) layer and a gold (Au) layer arranged sequentially from the side that is adjacent to and in contact with the P-type semiconductor regions 122 and the N-type semiconductor regions 124. According to another embodiment, the Schottky electrode 190 may include a nickel (Ni) layer and a gold (Au) layer arranged sequentially from the side that is adjacent to and in contact with the P-type semiconductor regions 122 and the N-type semiconductor regions 124. According to another embodiment, the Schottky electrode 190 may consist of only a palladium (Pd) layer, may consist of only a nickel (Ni) layer or may consist of only a tungsten (W) layer.

In the embodiments described above, the semiconductor device 10 includes the substrate 110 that is placed between the semiconductor layer 125 and the rear face electrode 170. The disclosure is, however, not limited to this configuration. According to another embodiment, the semiconductor device 10 may not include the substrate 110 and may include the rear face electrode 170 that is formed on the −Z-axis direction side face of the semiconductor layer 125. The configuration that the semiconductor device 10 includes the substrate 110 having the higher donor concentration than the donor concentration of the semiconductor layer 125, however, reduces the contact resistance between the substrate 110 and the rear face electrode 170 and provides good ohmic contact between the substrate 110 and the rear face electrode 170.

In any of the above embodiments, any other suitable materials may be employed as the material of the rear face electrodes 170. These other materials may be, for example, other metals such as vanadium (V) and hafnium (Hf).

What is claimed is:

1. A merged PiN Schottky (MPS) diode, comprising:
a first semiconductor layer being an N type;
P-type semiconductor regions and N-type semiconductor regions disposed alternately on a surface of the first semiconductor layer; and
a Schottky electrode being in a Schottky junction with the N-type semiconductor regions and arranged to be adjacent to and in contact with at least a part of the P-type semiconductor regions,
wherein a donor concentration in an area of an N-type semiconductor region of the N-type semiconductor regions that is adjacent to and in contact with the first semiconductor layer is lower than the donor concentration in an area of the first semiconductor layer that is adjacent to and in contact with the N-type semiconductor region and is lower than the donor concentration in an area of the N-type semiconductor region that is adjacent to and in contact with the Schottky electrode, and
wherein the P-type semiconductor regions are directly in contact with the first semiconductor layer.

2. The MPS diode according to claim 1, wherein, with respect to a direction from the first semiconductor layer toward the Schottky electrode, when the N-type semiconductor region is divided into two parts, an average donor concentration in a Schottky electrode-side part of the N-type semiconductor region is higher than the average donor concentration in a first semiconductor layer-side part of the N-type semiconductor region.

3. The MPS diode according to claim 1, wherein, with respect to a direction from the first semiconductor layer toward the Schottky electrode, the donor concentration in the N-type semiconductor region is kept constant or is gradually decreased from a Schottky electrode side thereof toward a first semiconductor layer side thereof.

4. The MPS diode according to claim 1, wherein, with respect to a direction from the first semiconductor layer toward the Schottky electrode, the donor concentration in the N-type semiconductor region is gradually decreased from a Schottky electrode side thereof toward a first semiconductor layer side thereof.

5. The MPS diode according to claim 1, wherein, with respect to a direction from the first semiconductor layer toward the Schottky electrode, the N-type semiconductor region includes an area where the donor concentration is constant.

6. The MPS diode according to claim 1, wherein an average acceptor concentration in the P-type semiconductor region is not lower than 100 times of an average donor concentration in the first semiconductor layer.

7. The MPS diode according to claim 1, wherein, with respect to a direction from the first semiconductor layer toward the Schottky electrode, an average acceptor concentration in the P-type semiconductor region is higher than an average donor concentration in a first semiconductor layer-side part of the N-type semiconductor region when the N-type semiconductor region is divided into two equal parts.

8. The MPS diode according to claim 1, wherein a surface of a P-type semiconductor region of the P-type semiconductor regions that is adjacent to and in contact with the first semiconductor layer is approximately flush with a surface of the N-type semiconductor region that is adjacent to and in contact with the first semiconductor layer.

9. The MPS diode according to claim 1, further comprising:
an N-type ohmic electrode located on an opposite side to the Schottky electrode with respect to the first semiconductor layer.

10. The MPS diode according to claim 1, wherein the P-type semiconductor region and the N-type semiconductor region mainly comprise gallium nitride.

11. The MPS diode according to claim 1, wherein the N-type semiconductor region contains silicon, and the P-type semiconductor region contains magnesium.

12. The MPS diode according to claim 9, further comprising:
a second semiconductor layer being an N type, located between the first semiconductor layer and the N-type ohmic electrode and having an average donor concentration higher than the average donor concentration in the first semiconductor layer.

13. The MPS diode according to claim 1, wherein the P-type semiconductor regions are arranged at respective ends of an array of the P-type semiconductor regions and the N-type semiconductor regions arranged alternately.

14. The MPS diode according to claim 13, further comprising:
a field plate electrode electrically connected with the Schottky electrode and provided to cover the P-type semiconductor regions arranged at the respective ends via an insulation film,
wherein, with respect to a direction from the first semiconductor layer toward the Schottky electrode, a first most semiconductor layer-side surface of the field plate electrode is located on a Schottky electrode side of a surface of the P-type semiconductor region that is adjacent to and in contact with the first semiconductor layer and is located on a first semiconductor layer side of a surface of the N-type semiconductor region that is adjacent to and in contact with the Schottky electrode.

15. The MPS diode according to claim 1, wherein bottom surfaces of the P-type semiconductor regions are flush with bottom surfaces of the N-type semiconductor regions.

16. The MPS diode according to claim 1, wherein the N-type semiconductor regions and the P-type semiconductor regions are continuously arranged alternately between respective ends of an array of the P-type semiconductor regions and the N-type semiconductor regions such that a width of each of the N-type semiconductor regions is the same.

17. A diode, comprising:
a semiconductor layer;
P-type semiconductor regions and N-type semiconductor regions disposed alternately on a surface of the semiconductor layer; and
a Schottky electrode being in a Schottky junction with the N-type semiconductor regions and arranged to be adjacent to and in contact with at least a part of the P-type semiconductor regions,
wherein a donor concentration in an area of an N-type semiconductor region of the N-type semiconductor regions that is adjacent to and in contact with the semiconductor layer is lower than the donor concentration in an area of the semiconductor layer that is adjacent to and in contact with the N-type semiconductor region and is lower than the donor concentration in an area of the N-type semiconductor region that is adjacent to and in contact with the Schottky electrode, and
wherein the P-type semiconductor regions are directly in contact with the semiconductor layer.

18. The MPS diode according to claim 17, wherein bottom surfaces of the P-type semiconductor regions are flush with bottom surfaces of the N-type semiconductor regions.

* * * * *